(12) United States Patent
Ootani et al.

(10) Patent No.: US 9,113,564 B2
(45) Date of Patent: Aug. 18, 2015

(54) CIRCUIT BOARD

(71) Applicant: Sony Corporation, Tokyo (JP)

(72) Inventors: Motohiko Ootani, Aichi (JP); Norikimi Moriuchi, Aichi (JP)

(73) Assignee: SONY CORPORATION, Tokyo (JP)

( * ) Notice: Subject to any disclaimer, the term of this patent is extended or adjusted under 35 U.S.C. 154(b) by 275 days.

(21) Appl. No.: 13/717,901

(22) Filed: Dec. 18, 2012

(65) Prior Publication Data

US 2013/0206456 A1 Aug. 15, 2013

(30) Foreign Application Priority Data

Feb. 15, 2012 (JP) ................. 2012-030939

(51) Int. Cl.
*H05K 1/11* (2006.01)
*H05K 1/02* (2006.01)
*H05K 3/34* (2006.01)

(52) U.S. Cl.
CPC .............. *H05K 1/111* (2013.01); *H05K 1/0269* (2013.01); *H05K 3/3421* (2013.01); *H05K 2201/099* (2013.01); *H05K 2201/09381* (2013.01)

(58) Field of Classification Search
USPC .................................... 174/250, 255
See application file for complete search history.

(56) References Cited

U.S. PATENT DOCUMENTS

| 5,303,122 A * | 4/1994 | Adams et al. ................. 361/767 |
| 5,453,582 A * | 9/1995 | Amano et al. ................ 174/261 |
| 7,995,353 B2 * | 8/2011 | Liao .............................. 361/767 |
| 2010/0181102 A1 * | 7/2010 | Abe et al. ...................... 174/260 |

* cited by examiner

*Primary Examiner* — Timothy Thompson
*Assistant Examiner* — Charles Pizzuto
(74) *Attorney, Agent, or Firm* — Oblon, McClelland, Maier & Neustadt, L.L.P.

(57) ABSTRACT

There is provided a circuit board including a land provided on a mounting surface for joining a distal end portion of a connection terminal of a lead component by a solder, wherein the land is formed to extend in a predetermined direction such that the predetermined direction is a longitudinal direction and a lateral direction orthogonal to the longitudinal direction is a width direction, wherein the land includes a terminal-facing portion facing the distal end portion of the connection terminal and a distal end side continuous portion continuously extending from the terminal-facing portion in the distal end portion of the connection terminal, and wherein the land includes a narrow portion having a width smaller than a width of the distal end side continuous portion in the terminal-facing portion.

6 Claims, 11 Drawing Sheets

6 ··· LAND
11 ··· TERMINAL-FACING PORTION
11a ··· NARROW PORTION
12 ··· DISTAL END SIDE CONTINUOUS PORTION
13 ··· PROXIMAL END SIDE CONTINUOUS PORTION
14 ··· RECESSED PORTION

1 ··· CIRCUIT BOARD
3 ··· LEAD COMPONENT
8 ··· CONNECTION TERMINAL
8c ··· JOINING PORTION (DISTAL END PORTION)
15 ··· SOLDER

6 · · · LAND
11 · · · TERMINAL-FACING PORTION
11a · · · NARROW PORTION
12 · · · DISTAL END SIDE CONTINUOUS PORTION
13 · · · PROXIMAL END SIDE CONTINUOUS PORTION
14 · · · RECESSED PORTION

6 · · · LAND
8c · · · JOINING PORTION (DISTAL END PORTION)
11 · · · TERMINAL-FACING PORTION
11a · · · NARROW PORTION
12 · · · DISTAL END SIDE CONTINUOUS PORTION
13 · · · PROXIMAL END SIDE CONTINUOUS PORTION
14 · · · RECESSED PORTION

3 ··· LEAD COMPONENT
6 ··· LAND
8 ··· CONNECTION TERMINAL
8c ··· JOINING PORTION (DISTAL END PORTION)
11 ··· TERMINAL-FACING PORTION
11a ··· NARROW PORTION
12 ··· DISTAL END SIDE CONTINUOUS PORTION
13 ··· PROXIMAL END SIDE CONTINUOUS PORTION
15 ··· SOLDER

3 · · · LEAD COMPONENT
6 · · · LAND
8 · · · CONNECTION TERMINAL
8c · · · JOINING PORTION (DISTAL END PORTION)
11 · · · TERMINAL-FACING PORTION
11a · · · NARROW PORTION
12 · · · DISTAL END SIDE CONTINUOUS PORTION
13 · · · PROXIMAL END SIDE CONTINUOUS PORTION
15 · · · SOLDER

6 · · · LAND
11 · · · TERMINAL-FACING PORTION
11a · · · NARROW PORTION
15 · · · SOLDER

6 · · · LAND
12 · · · DISTAL END SIDE CONTINUOUS PORTION
15 · · · SOLDER

6 ··· LAND
8 ··· CONNECTION TERMINAL
11 ··· TERMINAL-FACING PORTION
11a ··· NARROW PORTION
12 ··· DISTAL END SIDE CONTINUOUS PORTION
13 ··· PROXIMAL END SIDE CONTINUOUS PORTION
14 ··· RECESSED PORTION

6 ··· LAND
11 ··· TERMINAL-FACING PORTION
11a ··· NARROW PORTION
12 ··· DISTAL END SIDE CONTINUOUS PORTION
13 ··· PROXIMAL END SIDE CONTINUOUS PORTION
14 ··· RECESSED PORTION (A)

(B)

CIRCUIT BOARD

BACKGROUND

The present disclosure relates to a circuit board. More particularly, the present disclosure relates to the field of improving the accuracy of detecting whether a solder joint of a connection terminal to a land is successful or not, by providing a narrow portion which is narrower than other portions. The land is used to join a distal end portion of the connection terminal of a lead component by soldering.

A variety of kinds of electronic devices such as a television receiver, personal computer, and audio equipment include a circuit board disposed therein. The circuit board may include a wiring plate on which a circuit pattern is formed on an insulation substrate using a copper foil and a plurality of electronic parts mounted on the circuit pattern of the wiring plate.

In such a circuit board, a lead component such as a QFP (Quad Flat Package) or a connector may be used as electronic parts. The lead component includes a main body formed of ceramic and other material, and a plurality of connection terminals protruding from each side of the main body. Each of the connection terminals is joined to each corresponding land of the circuit pattern by soldering (for example, see FIG. 6 in Japanese Patent Application Laid-Open Publication No. 2003-10216).

The lead component is a component in which the quality of electronic devices in the market is greatly affected by thermal deformation behavior and the quality in the initial stage. The lead component is necessary to ensure the high quality of circuit board in a mounting process.

Therefore, in the mounting process of the lead component, after the lead component is mounted such that each of the connection terminals is joined to each corresponding land by reflow soldering, an inspection device inspects whether a solder joint of the connection terminal to the land is successful or not.

The inspection of whether the solder joint is successful or not is performed by two- or three-dimensional image detection or the like.

In a two-dimensional inspection, for example, light is irradiated on a soldered portion at a distal end side of the connection terminal from among the solders (solder fillets) applied to the lands, and the light is irradiated in a direction perpendicular or oblique to the soldered portion. Then, the determination of whether the solder joint is successful or not is made based on the difference in the shape or luminance level of the portion irradiated with light.

In addition, in a three-dimensional inspection, for example, a float amount indicating how far away the connection terminal is from the land is detected, and then the determination of whether the solder joint is successful or not is made based on the float amount of the connection terminal with respect to the land.

SUMMARY

However, in a circuit board according to the related art, a land is formed in a rectangular shape. Thus, it is very difficult to differentiate between the shape of a solder e in a case where a connection terminal b of a lead component a is joined to a land d of the circuit board c by the solder e in a good soldering state as shown in FIG. 11A, and the shape of a solder e' in a case where a solder joint failure is occurred in a state where the connection terminal b and the land d are just close together as shown in FIG. 11B.

As a result, in the two-dimensional inspection, it is very difficult to differentiate between a reflection direction of light irradiated on a portion at a distal end side of the connection terminal b with respect to the solder e and a reflection direction of light irradiated on a portion at a distal end side of the connection terminal b with respect to the solder e'. Thus, there is a problem that the accuracy of determining whether a solder joint is successful or not by an inspection device is lowered, and the detection accuracy is lowered accordingly.

In addition, in the three-dimensional inspection, as described above, the determination of whether the solder joint is successful or not is made based on the float amount of the connection terminal b with respect to the land d.

In this regard, each of FIG. 12C and FIG. 12D shows a good solder joint and FIG. 12E shows a bad solder joint. In this case, a state of FIG. 12D having a good solder joint is likely to be determined to be a solder joint failure because it has exceeded a threshold H. Also, a state of FIG. 12E having a bad solder joint is likely to be determined to be a solder joint success because it has not exceeded the threshold H.

Therefore, an embodiment of the present disclosure is made to overcome the above problem, and provides a circuit board capable of improving accuracy of detecting whether a solder joint of a connection terminal to a land is successful or not.

According to an embodiment of the present disclosure, there is provided a circuit board includes a land and a narrow portion. The land is provided on a mounting surface and used as a portion to which a distal end portion of a connection terminal of a lead component is joined by a solder. The land is formed to extend to a predetermined direction such that the predetermined direction is a longitudinal direction of the land and a lateral direction orthogonal to the longitudinal direction is a width direction of the land. The land includes a terminal-facing portion facing the distal end portion of the connection terminal and a distal end side continuous portion continuously extending from the terminal-facing portion in the distal end portion of the connection terminal. The narrow portion is provided in the terminal-facing portion. The narrow portion has a width smaller than a width of the distal end side continuous portion.

In accordance with the circuit board according to the embodiment of the present disclosure, there is a clear distinction between the shape of the solder when the connection terminal is joined to the land in a good soldering state and the shape of the solder when the connection terminal is joined to the land in a bad soldering state.

In the circuit board according to the embodiment of the present disclosure described above, the narrow portion is preferably formed to include a recessed portion formed at one side of the narrow portion in the width direction, and the recessed portion is preferably opened in the width direction.

The narrow portion is formed to include a recessed portion formed at one side of the narrow portion in the width direction and the recessed portion is opened in the width direction, thereby ensuring good workability of the land.

In the circuit board according to the embodiment of the present disclosure described above, the narrow portion is preferably formed to include a recessed portion formed at both sides respectively of the narrow portion in the width direction, and the recessed portion is preferably opened in the width direction.

According to the configuration that the narrow portion is preferably formed to include a recessed portion formed at both sides respectively of the narrow portion in the width direction and the recessed portion is opened in the width direction, it is possible to ensure good workability of the land.

In the circuit board according to the embodiment of the present disclosure described above, the distal end side continuous portion preferably has a width greater than a width of the connection terminal, and the narrow portion preferably has a width smaller than the width of the connection terminal.

The distal end side continuous portion has a width greater than a width of the connection terminal and the narrow portion has a width smaller than the width of the connection terminal, thereby ensuring an amount of the solder sufficient to be applied to the distal end side continuous portion.

In the circuit board according to the embodiment of the present disclosure described above, the distal end side continuous portion preferably has a length greater than that of the narrow portion.

The configuration of the distal end side continuous portion having a length greater than the length of the narrow portion makes it possible to ensure a length of the distal end side continuous portion necessary to perform an inspection, even when the positional accuracy of the lead component with respect to the land at the time of mounting or the position detection accuracy of the inspection device with respect to the land is lowered.

In the circuit board according to the embodiment of the present disclosure described above, the land is preferably provided to include a proximal end side continuous portion continuously extending from the terminal-facing portion on the opposite side of the distal end side continuous portion such that the terminal-facing portion is disposed between the proximal end side continuous portion and the distal end side continuous portion.

According to the configuration that the land is provided to include a proximal end side continuous portion continuously extending from the terminal-facing portion on the opposite side of the distal end side continuous portion such that the terminal-facing portion is disposed between the proximal end side continuous portion and the distal end side continuous portion, it is possible for the proximal end side continuous portion to be adhered closely to the connection terminal applied by the solder.

The circuit board according to an embodiment of the present disclosure includes a land provided on a mounting surface for joining a distal end portion of a connection terminal of a lead component by a solder. The land is formed to extend in a predetermined direction such that the predetermined direction is a longitudinal direction and a lateral direction orthogonal to the longitudinal direction is a width direction. The land is provided with a terminal-facing portion facing the distal end portion of the connection terminal and a distal end side continuous portion continuously extending from the terminal-facing portion in the distal end portion of the connection terminal. The land includes a narrow portion having a width smaller than a width of the distal end side continuous portion in the terminal-facing portion.

According to the configuration described above, there is a clear distinction between the shape of the solder on the distal end side continuous portion depending on whether the solder joint is successful or not, thereby improving accuracy of detecting whether the solder joint of the connection terminal to the land is successful or not.

In the circuit board according to an embodiment of the present disclosure, the narrow portion has a recessed portion formed at one side thereof in the width direction, and the recessed portion is opened in the width direction.

According to the configuration described above, the narrow portion can be formed easily while ensuring better workability of the land.

In the circuit board according to an embodiment of the present disclosure, the narrow portion has recessed portions formed at both sides thereof in the width direction and the recessed portions is opened in the width direction.

According to the configuration described above, the narrow portion can be formed easily while ensuring better workability of the land.

In the circuit board according to an embodiment of the present disclosure, the distal end side continuous portion has a width greater than a width of the connection terminal, and the narrow portion has a width smaller than the width of the connection terminal.

According to the configuration described above, the narrow portion can be formed on the land while ensuring a sufficient amount of the solder applied on the distal end side continuous portion and ensuring a good joining of the connection terminal to the land.

In the circuit board according to an embodiment of the present disclosure, the distal end side continuous portion has a length greater than a length of the narrow portion.

According to the configuration described above, the distal end side continuous portion has a sufficient length. Thus, even when the positional accuracy of the lead component with respect to the land at the time of mounting or the position detection accuracy of the inspection device with respect to the land is lowered, it is ensured that the accuracy of detecting whether the solder joint of the connection terminal to the land is successful or not, because the distal end side continuous portion has a length which is necessary to perform an inspection.

In the circuit board according to an embodiment of the present disclosure, the land includes a proximal end side continuous portion continuously extending from the terminal-facing portion on the opposite side of the distal end side continuous portion such that the terminal-facing portion is disposed between the proximal end side continuous portion and the distal end side continuous portion.

According to the configuration described above, the proximal end side continuous portion can be adhered closely to the connection terminal applied by the solder, thereby ensuring a good joining of the connection terminal to the land.

BRIEF DESCRIPTION OF THE DRAWINGS

FIGS. 11A and 11B illustrate a joining state of a connection terminal in a circuit board according to related art, in which FIG. 11A is a partial enlarged side view in cross-section showing a state where the connection terminal is joined to a land in a good soldering state, and FIG. 11B is a partial enlarged side view in cross-section showing a state where the connection terminal is joined to the land in a bad soldering state; and FIGS. 12C to 12E illustrate another joining state of the connection terminal in the circuit board according to related art, in which FIGS. 12C and 12D are partial enlarged side views in cross-section showing a state where the connection terminal is joined to a land in a good soldering state, and FIG. 12E is a partial enlarged side view in cross-section showing a state where the connection terminal is joined to the land in a bad soldering state.

DETAILED DESCRIPTION OF THE EMBODIMENT(S)

Figure 1:
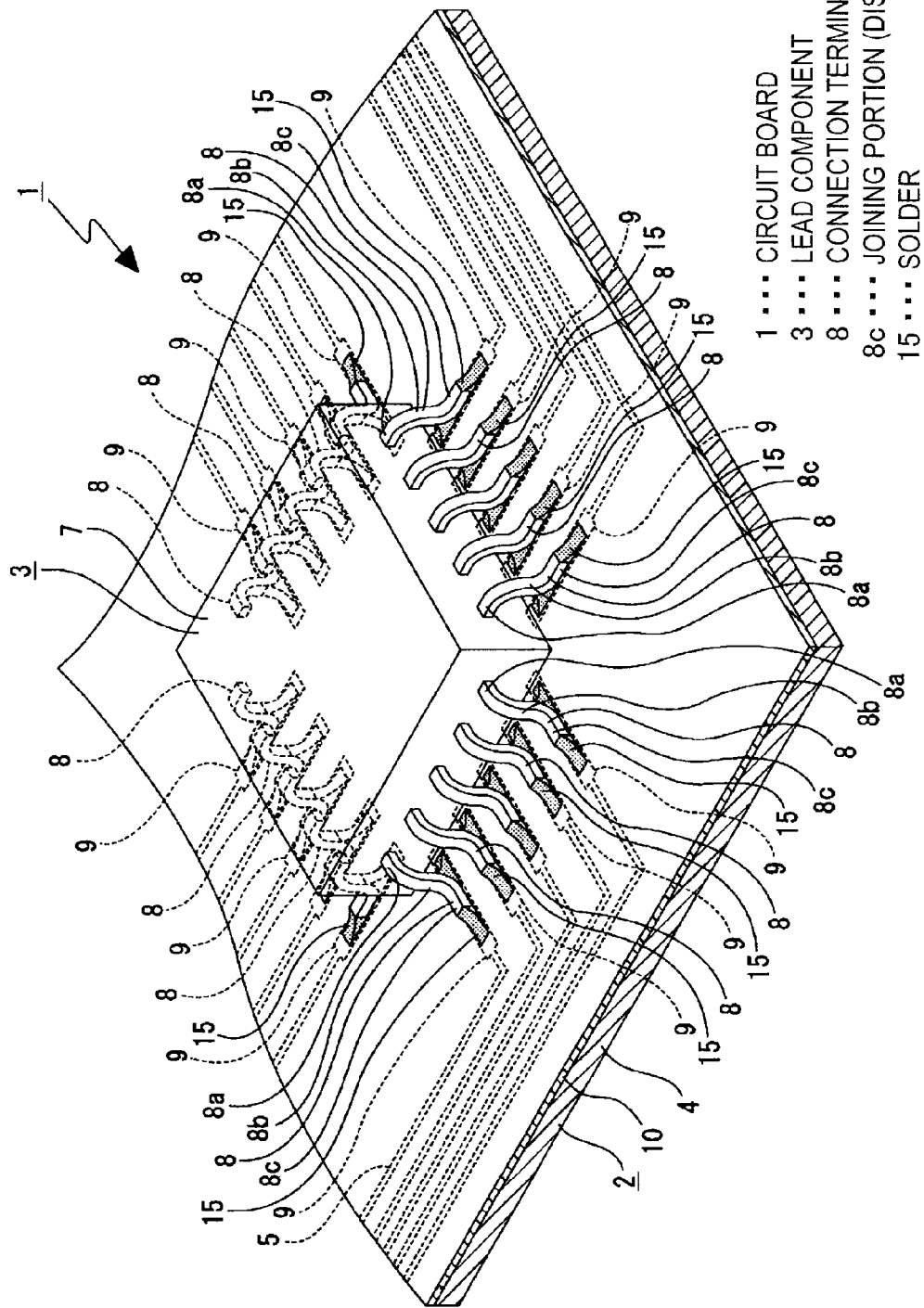
FIG. 1 illustrates a best mode contemplated for practicing a circuit board according to embodiments of the present disclosure along with from FIG. 2 to FIG. 10, and specifically is a partial enlarged perspective view showing the circuit board.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

[Configuration of Circuit Board]

A circuit board 1 has a wiring plate 2 and a plurality of electronic parts including a lead component 3 mounted on the wiring plate 2 (referring to FIG. 1).

The wiring plate 2 has an insulating substrate 4 with a predetermined circuit pattern 5 formed thereon. The lead component 3 is mounted on a plurality of lands 6 formed on a distal end portion of the circuit pattern 5.

Examples of the insulating substrate 4 include a glass epoxy substrate, a paper phenol substrate, a paper epoxy substrate, a glass composite substrate, and other substrate. The circuit pattern 5 is formed with a copper foil having a thickness on the order of several tens of micrometers (μm).

The lead component 3 has a main body 7 and a plurality of connection terminals 8 protruding outward from an outer circumference surface of the main body 7. The connection terminal 8 has a base portion 8a protruding laterally from the main body 7, an intermediate portion 8b bent in the direction perpendicular to the base portion 8a, and a joining portion 8c bent in the direction perpendicular to the intermediate portion 8b. The joining portion 8c is a distal end portion of the connection terminal 8 and is a portion to be joined to the land 6 by soldering.

Figure 2:
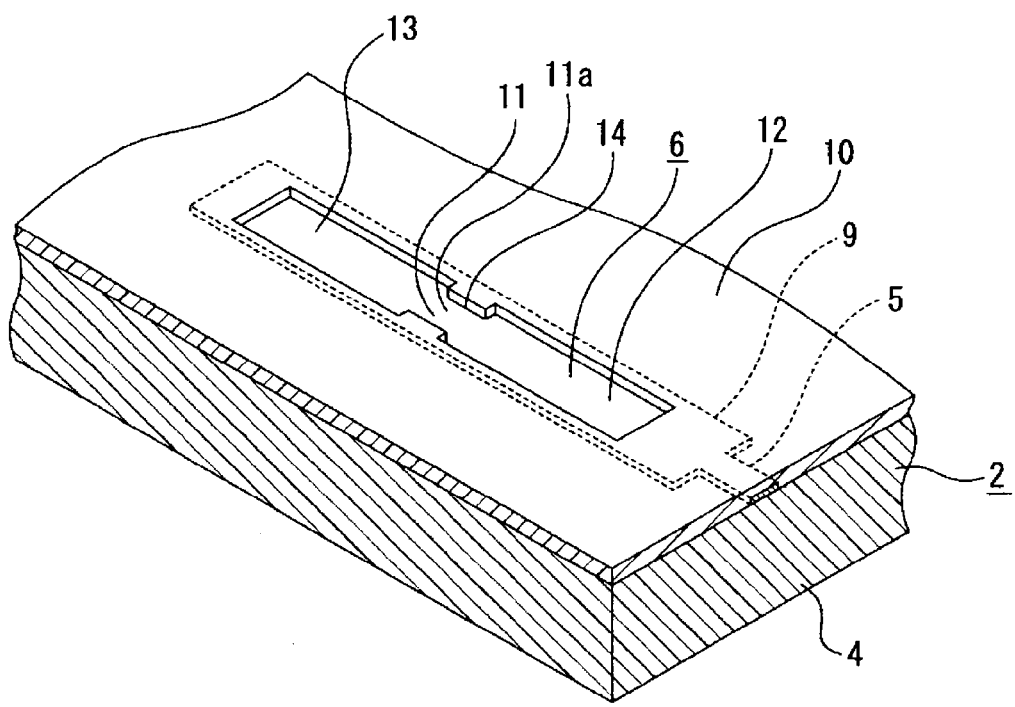
FIG. 2 is a partial enlarged perspective view showing a wiring plate.

The land 6 is formed as a part of a rectangular base material 9 extending in one direction (referring to FIG. 2). More specifically, a mask process is performed by applying a resist 10 on the wiring plate 2, and a portion other than the outer circumference portion of the base material 9 covered with the resist 10 is provided as the land 6.

Figure 3:
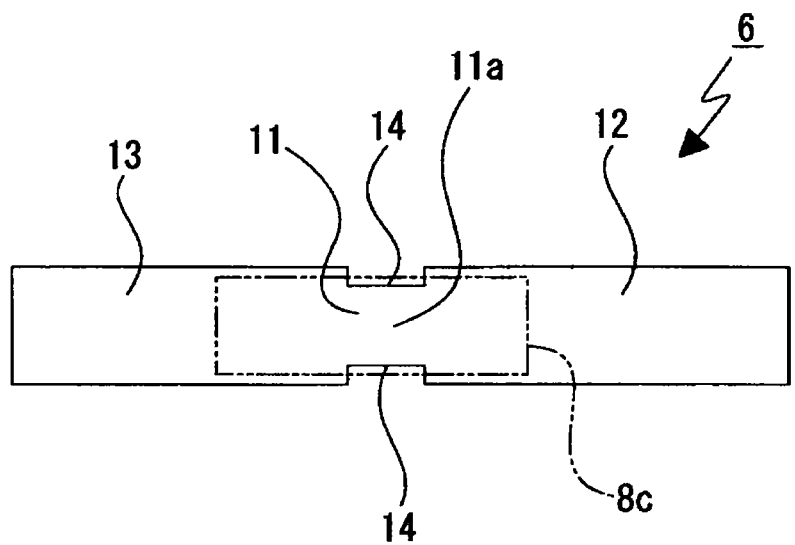
FIG. 3 is an enlarged plan view of a land.

An intermediate portion of the land 6 in a longitudinal direction is formed as a terminal-facing portion 11 (referring to FIGS. 2 and 3). The terminal-facing portion 11 is a portion which faces the joining portion 8c of the connection terminal 8.

The land 6 has a distal end side continuous portion 12 and a proximal end side continuous portion 13. The distal end side continuous portion 12 is extended from the terminal-facing portion 11 at one end in the longitudinal direction, and the proximal end side continuous portion 13 is extended from the terminal-facing portion 11 at the other end in the longitudinal direction.

An intermediate portion of the terminal-facing portion 11 in the longitudinal direction is formed as a narrow portion 11a having a width (length in the lateral direction) smaller than other portions of the terminal-facing portion 11. The narrow portion 11a, for example, has a recessed portion 14 at both sides respectively in the width direction. Each of the recessed portions is opened in the width direction (lateral direction).

Portions other than the narrow portion 11a of the terminal-facing portion 11 have a width greater than that of the connection terminal 8 and have the same width as the distal end side continuous portion 12. In addition, the width of the narrow portion 11a is smaller than or equal to the width of the connection terminal 8.

The distal end side continuous portion 12 has a length greater than that of the narrow portion 11a of the terminal-facing portion 11.

[Mounting of Lead Component]

Figure 4:
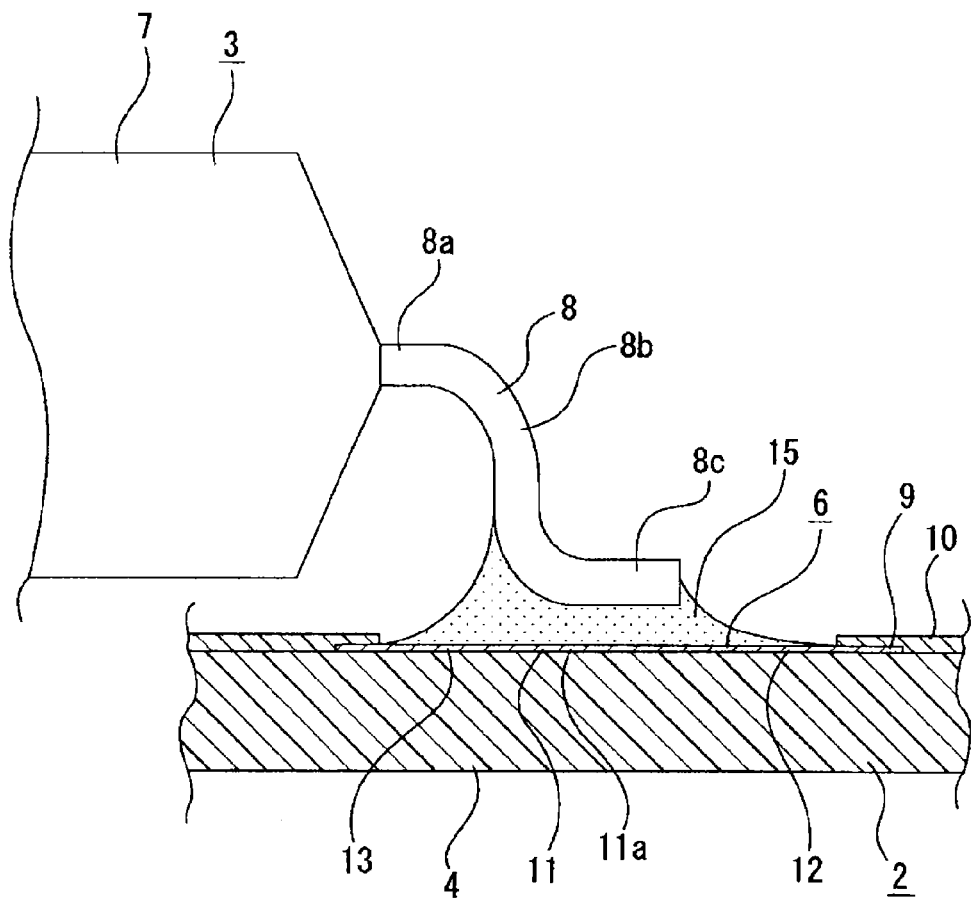
FIG. 4 is a partial enlarged side view in cross-section showing a case where a connection terminal is joined to the land in a good soldering state.

The lead component 3 is mounted on the wiring plate 2 so that the joining portion 8c of the connection terminal 8 is joined to the land 6 by a solder 15 (referring to FIG. 4).

When the joining portion 8c of the connection terminal 8 is joined to the land 6 in a good soldering state, as shown in FIG. 4, the solder 15 is adhered closely to each side of the joining portion 8c. In this case, the outer surface of the solder 15 is formed into a gentle concave curved surface, resulting in forming a mountain shape, without depending on the shape of the land 6.

Figure 5:
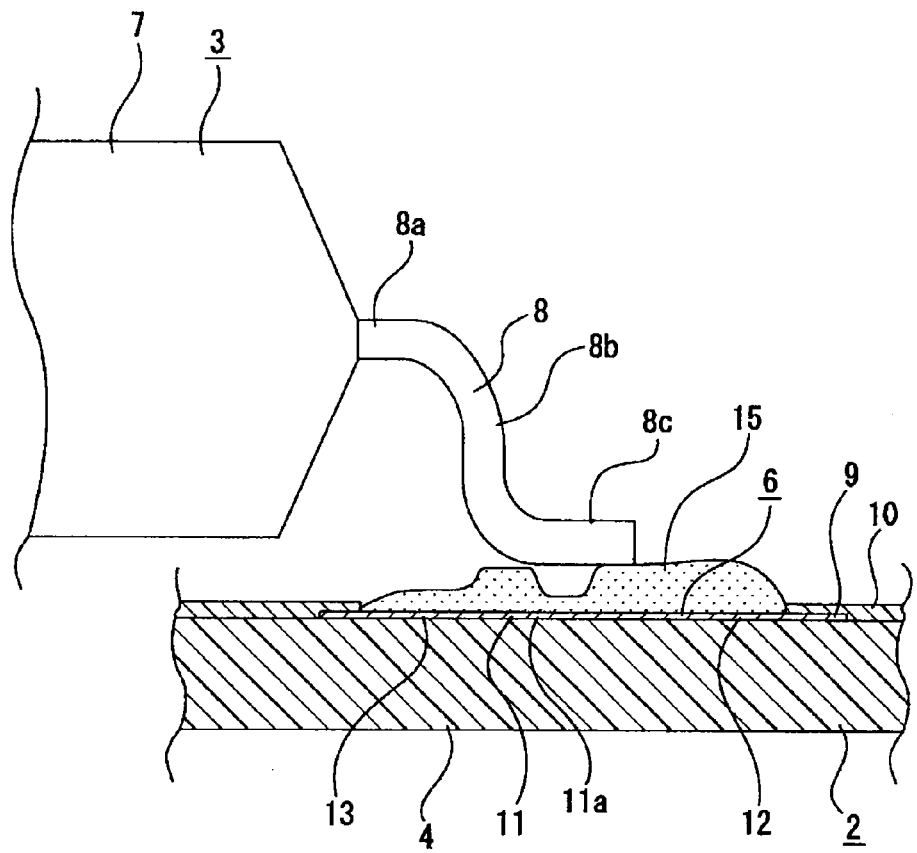
FIG. 5 is a partial enlarged side view in cross-section showing a case where a solder joint failure of the connection terminal occurs.
Figure 6:
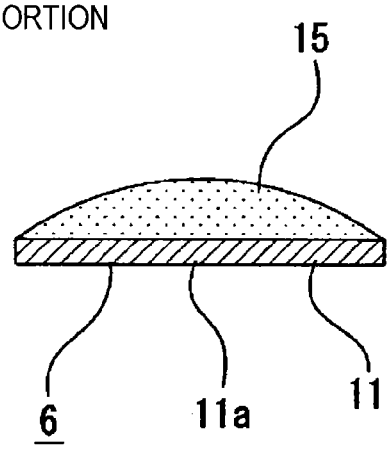
FIG. 6 is an enlarged sectional view showing a state of the solder applied to a terminal-facing portion of the land.
Figure 7:
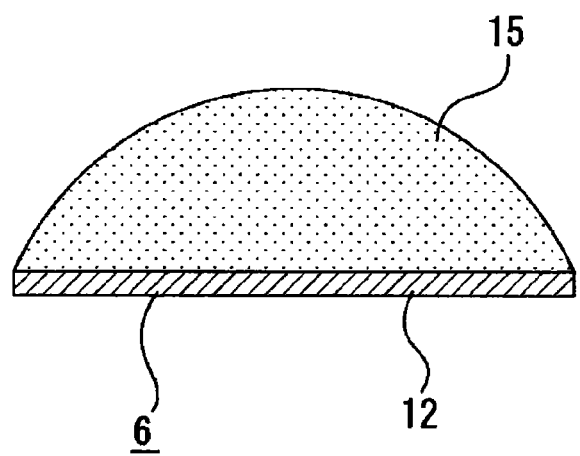
FIG. 7 is an enlarged sectional view showing a state of the solder applied to a distal end side continuous portion of the land.

On the other hand, when a solder joint failure occurs in the joining portion 8c of the connection terminal 8, as shown in FIG. 5, the solder 15 does not adhere closely to the joining portion 8c, and is formed into a shape depending on the shape of the land 6. More specifically, since the surface curvature of each of the solder 15 has the same cross-sectional shape in the lateral direction irrespective of position of the soldered portion in the longitudinal direction of the land 6, the solder 15 has a low height as a portion of the land 6 applied with the solder 15 has a smaller width. Thus, the solder is formed to be lower at the narrow portion 11a (referring to FIG. 6) and to be higher at the distal end side continuous portion 12 (referring to FIG. 7).

[Inspection of Whether Soldering is Successful by Inspection Device]

In a mounting process of the lead component 3, after the lead component 3 is mounted so that each of the connection terminals 8 is joined to the corresponding land 6 by reflow soldering, an inspection device (not shown) inspects whether the solder joint of the connection terminal to the land is successful.

The inspection in the inspection device is performed by irradiating with light on a soldered portion at the distal end side of the connection terminal 8 from among the solders 15 (solder fillets) applied to the lands 6, and the light is irradiated in a direction perpendicular or oblique to the soldered portion. When light is irradiated on the soldered portion at the distal end side of the connection terminal 8, for example, the reflected light is incident on a light detection unit of the inspection device. Then, the light detection unit of the inspection device detects the luminance level of the incident light, thereby determining whether the solder joint of each of the connection terminals 8 is successful or not.

When light is irradiated on the solder 15, if the joining portion 8c is joined to the land 6 in a good soldering state, then the reflected light is reflected at a large angle with respect to the incident light, as shown in FIG. 4.

Conversely, when light is irradiated on the solder 15, if the joining portion 8c is joined to the land 6 in a bad soldering state, then the reflected light is reflected at a small angle with respect to the incident light, as shown in FIG. 5.

As described above, because the reflection angles of the reflected lights are different from each other, the luminance level of light incident on the light detection unit is significantly different between the case where the joining portion 8c is joined to the land 6 in a good soldering state and the case where the joining portion 8c is joined to the land 6 in a bad soldering state. As a result, a distinction is made between the case where the joining portion 8c is joined to the land 6 in a good soldering state and the case where the joining portion 8c is joined to the land 6 in a bad soldering state, based on the luminance level of light incident on the light detection unit.

Figure 8:
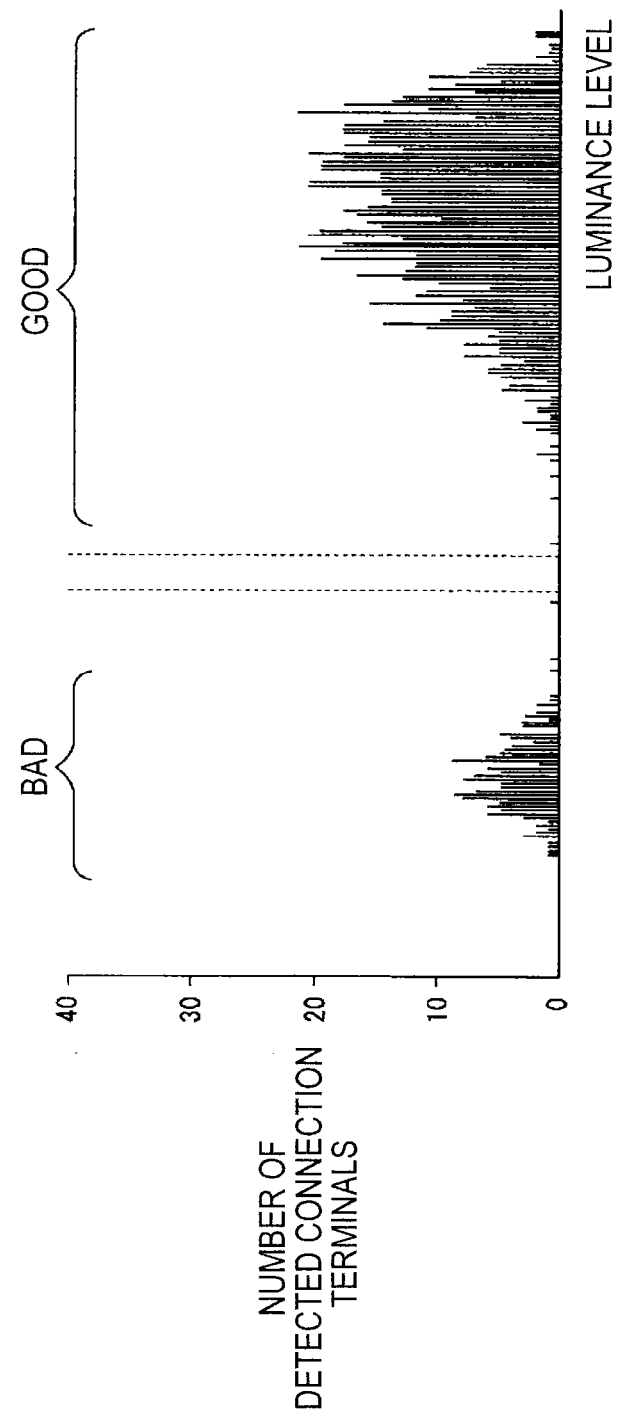
FIG. 8 is a graph showing results obtained by detecting the luminance level of light when an inspection device inspects whether a solder joint is successful or not.

FIG. 8 illustrates results obtained by detecting the luminance level of light when the inspection device inspects whether the solder joint is successful or not.

In FIG. 8, the horizontal axis indicates the luminance level of light, and the vertical axis indicates the number of the detected connection terminals 8. As shown in FIG. 8, a clear distinction in the luminance distribution is made between the case where a good solder joint is formed by the solder 15 and the case a solder joint failure occurs. Thus, it can be recognized that a reliable inspection is performed as to whether the solder joint is successful.

As described above, there is a clear distinction between the shape of the solder 15 formed at the distal end side continuous portion 12 when the joining portion 8c of the connection terminal 8 is joined to the land 6 in a good soldering state and the shape of the solder 15 formed on the distal end side continuous portion 12 when the joining portion 8c of the connection terminal 8 is joined to the land 6 in a bad soldering state. Thus, an operator can easily determines whether the solder joint is successful or not only by his appearance inspection.

[Conclusion]

As described above, in the circuit board 1, the narrow portion 11a having a width smaller than that of the distal end side continuous portion 12 is provided in the terminal-facing portion 11 of the land 6.

Therefore, the amount of the solder 15 applied on the narrow portion 11a is reduced, accordingly, the amount of solder to be applied on the distal end side continuous portion 12 will be increased. Additionally, the shape of the solder 15 (solder fillet) on the distal end side continuous portion 12 is significantly different from each other depending on whether the solder joint is successful or not. As a result, it is possible to improve the accuracy of detecting whether the solder joint of the connection terminal 8 to the land 6 is successful or not.

Moreover, the narrow portion 11a has a recessed portion 14 at both sides respectively in the width direction. Thus, the narrow portion 11a can be formed easily while ensuring good workability of the land 6.

Figure 9:
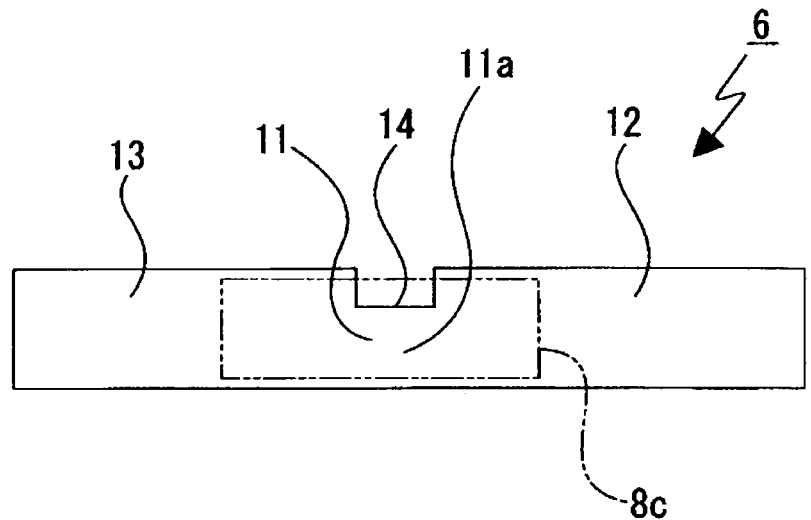
FIG. 9 is an enlarged plan view showing another example of the land.

As shown in FIG. 9, the narrow portion 11a may have the recessed portion 14 on one side in the width direction. In this case, the narrow portion 11a can be formed easily while ensuring better workability of the land 6.

Further, in the circuit board 1, the distal end side continuous portion 12 of the land 6 is formed to have a width greater than that of the connection terminal 8. In addition, the narrow portion 11a is formed to have a width smaller than or equal to the width of the connection terminal 8.

Therefore, the narrow portion 11a can be formed on the land 6 while ensuring a sufficient amount of the solder 15 applied on the distal end side continuous portion 12 and ensuring a good joining of the connection terminal 8 to the land 6.

Moreover, the distal end side continuous portion 12 has a length greater than the length of the narrow portion 11a.

Thus, the distal end side continuous portion 12 has a sufficient length. Thus, even when the positional accuracy of the lead component 3 with respect to the land 6 at the time of mounting or the position detection accuracy of the inspection device with respect to the land 6 is lowered, it is possible to improve the accuracy of detecting whether the solder joint of the connection terminal 8 to the land 6 is successful or not, because the distal end side continuous portion 12 has a length which is necessary to perform an inspection.

Furthermore, the proximal end side continuous portion 13 extending from the terminal-facing portion 11 is formed on the land 6 at the opposite side of the distal end side continuous portion 12 such that the terminal-facing portion 11 is disposed between the distal end side continuous portion 12 and the proximal end side continuous portion 13. For that reason, the solder 15 is applied to the proximal end side continuous portion 13 as well, and thus the proximal end side continuous portion 13 is adhered closely to the connection terminal 8, thereby ensuring a good solder joint of the connection terminal 8 with respect to the land 6.

[Modification]

Figure 10:
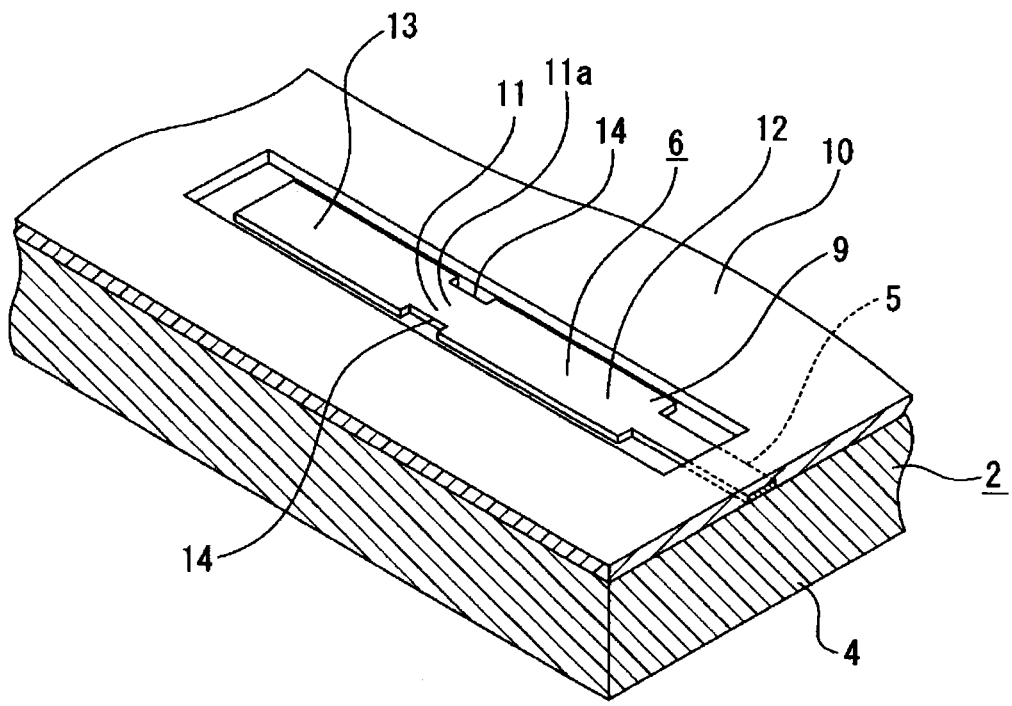
FIG. 10 is an enlarged perspective view showing still another example of the land.
Figure 11:
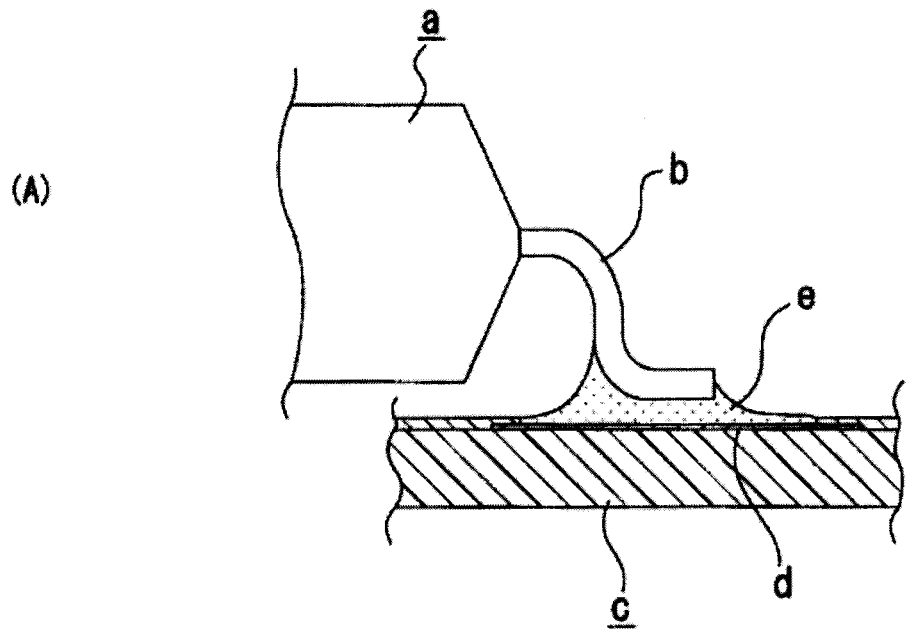
Figure 11:
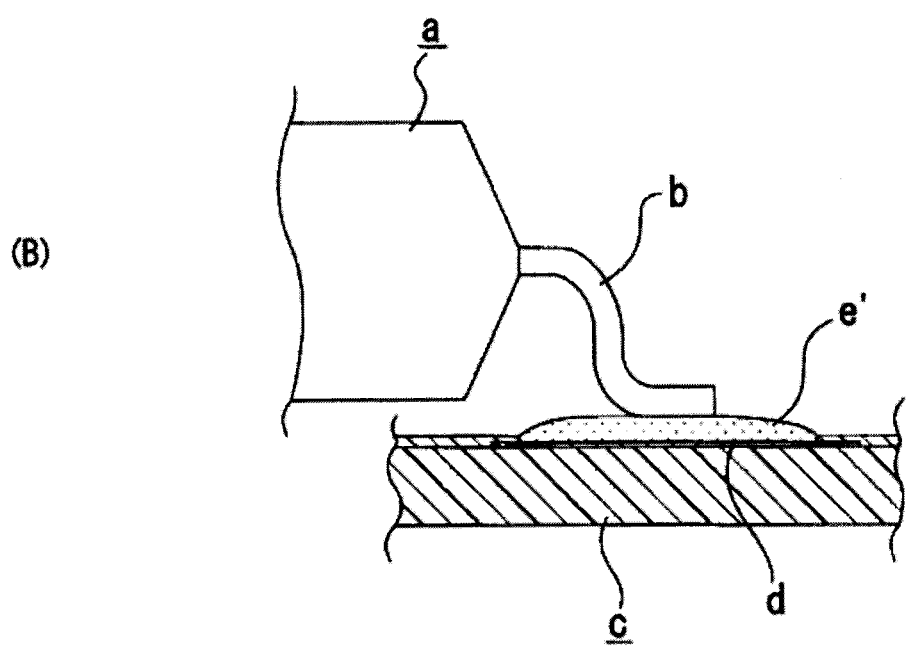
Figure 12:
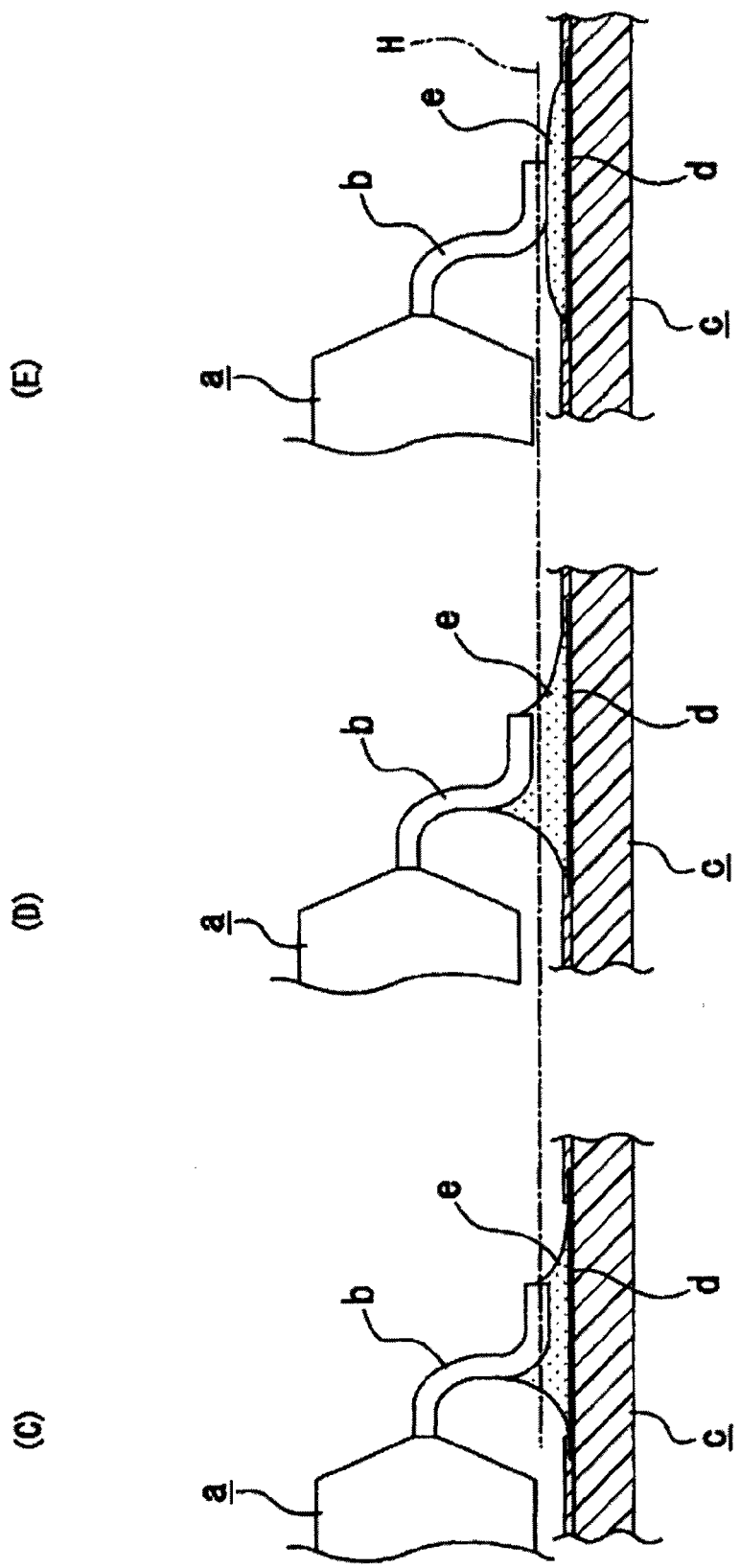

Although the embodiment has been described above as an example in which the land 6 is formed such that the outer circumference of the base material 9 is covered with the resist 10 (referring to FIG. 2), it is possible to provide the entire base material 9 as the land 6 without being covered by the resist 10, as shown in FIG. 10.

Embodiments of the Present Disclosure

Additionally, the present technology may also be configured as below.

(1) A circuit board including:
a land provided on a mounting surface for joining a distal end portion of a connection terminal of a lead component by a solder,
wherein the land is formed to extend in a predetermined direction such that the predetermined direction is a longitudinal direction and a lateral direction orthogonal to the longitudinal direction is a width direction,
wherein the land includes a terminal-facing portion facing the distal end portion of the connection terminal and a distal end side continuous portion continuously extending from the terminal-facing portion in the distal end portion of the connection terminal, and
wherein the land includes a narrow portion having a width smaller than a width of the distal end side continuous portion in the terminal-facing portion.

(2) The circuit board according to (1), wherein the narrow portion has a recessed portion formed at one side thereof in the width direction, and the recessed portion is opened in the width direction.

(3) The circuit board according to (1) or (2), wherein the narrow portion has recessed portions formed at both sides thereof in the width direction and the recessed portions is opened in the width direction.

(4) The circuit board according to any one of (1) to (3),
wherein the distal end side continuous portion has a width greater than a width of the connection terminal, and
wherein the narrow portion has a width smaller than the width of the connection terminal.

(5) The circuit board according to any one of (1) to (4), wherein the distal end side continuous portion has a length greater than a length of the narrow portion.

(6) The circuit board according to any one of (1) to (5), wherein the land includes a proximal end side continuous portion continuously extending from the terminal-facing portion on the opposite side of the distal end side continuous portion such that the terminal-facing portion is disposed between the proximal end side continuous portion and the distal end side continuous portion.

It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application JP 2012-030939 filed in the Japan Patent Office on Feb. 15, 2012, the entire content of which is hereby incorporated by reference.

What is claimed is:

1. A circuit board comprising:
 a land provided on a mounting surface for joining a distal end portion of a connection terminal of a lead component by a solder,
 wherein the land is formed to extend in a predetermined direction such that the predetermined direction is a longitudinal direction and a lateral direction orthogonal to the longitudinal direction is a width direction,
 wherein the land includes a terminal-facing portion facing the distal end portion of the connection terminal and a distal end side continuous portion continuously extending from the terminal-facing portion in the distal end portion of the connection terminal, and
 wherein the land includes a narrow portion having a width smaller than a width of the distal end side continuous portion in the terminal-facing portion and a width smaller than the width of the connection terminal.

2. The circuit board according to claim 1, wherein the narrow portion has a recessed portion formed at one side thereof in the width direction, and the recessed portion is opened in the width direction.

3. The circuit board according to claim 1, wherein the narrow portion has recessed portions formed at both sides thereof in the width direction and the recessed portions are opened in the width direction.

4. The circuit board according to claim 1,
 wherein the distal end side continuous portion has a width greater than a width of the connection terminal.

5. The circuit board according to claim 1, wherein the distal end side continuous portion has a length greater than a length of the narrow portion.

6. The circuit board according to claim 1, wherein the land includes a proximal end side continuous portion continuously extending from the terminal-facing portion on the opposite side of the distal end side continuous portion such that the terminal-facing portion is disposed between the proximal end side continuous portion and the distal end side continuous portion.

* * * * *